United States Patent
Di et al.

(10) Patent No.: US 11,914,092 B2
(45) Date of Patent: Feb. 27, 2024

(54) INDUCTIVE MAGNETIC SENSOR AND ELECTROMAGNETIC PROSPECTING EQUIPMENT

(71) Applicant: INSTITUTE OF GEOLOGY AND GEOPHYSICS, THE CHINESE ACADEMY OF SCIENCES, Beijing (CN)

(72) Inventors: Qingyun Di, Beijing (CN); Qihui Zhen, Beijing (CN); Yuliang Wang, Beijing (CN); Zhiyao Liu, Beijing (CN); Quanmin Yang, Beijing (CN)

(73) Assignee: INSTITUTE OF GEOLOGY AND GEOPHYSICS, THE CHINESE ACADEMY OF SCIENCES, Beijing (CN)

( * ) Notice: Subject to any disclaimer, the term of this patent is extended or adjusted under 35 U.S.C. 154(b) by 617 days.

(21) Appl. No.: 17/115,808

(22) Filed: Dec. 9, 2020

(65) Prior Publication Data
US 2021/0088689 A1    Mar. 25, 2021

Related U.S. Application Data

(63) Continuation of application No. PCT/CN2018/119362, filed on Dec. 5, 2018.

(51) Int. Cl.
*G01V 3/08* (2006.01)
*H01F 27/24* (2006.01)
(Continued)

(52) U.S. Cl.
CPC .............. *G01V 3/081* (2013.01); *H01F 27/24* (2013.01); *H01F 27/28* (2013.01);
(Continued)

(58) Field of Classification Search
CPC .......... G01V 3/081; G01V 3/10; H01F 27/24; H01F 27/28; H03F 3/45475;
(Continued)

(56) References Cited

U.S. PATENT DOCUMENTS

| | | | |
|---|---|---|---|
| 6,417,666 B1 * | 7/2002 | Mercer | G01C 9/20 175/45 |
| 2011/0133733 A1 * | 6/2011 | Nagasaki | G01R 33/063 324/252 |

(Continued)

FOREIGN PATENT DOCUMENTS

| | | |
|---|---|---|
| CN | 102147482 A | 8/2011 |
| CN | 102854535 A | 1/2013 |

(Continued)

OTHER PUBLICATIONS

International Search Report issued in corresponding International application No. PCT/CN2018/119362, dated Aug. 27, 2019.

(Continued)

*Primary Examiner* — Akm Zakaria

(57) ABSTRACT

The present disclosure provides an inductive magnetic sensor, which includes a signal pre-amplifying measurement circuit, a feedback loop, a magnetic core and coil group, a low-noise autozero processing circuit, and an output protection module. The magnetic core and coil group is electrically connected between the signal pre-amplifying measurement circuit and the feedback loop, the signal pre-amplifying measurement circuit comprises the low-noise autozero processing circuit, and the feedback loop and the low-noise autozero processing circuit are electrically connected to the output protection module respectively. By introducing the resonant notch filter, it may extend the passband to the low frequency, and extend the low-frequency characteristic of the magnetic sensor, to obtain a (Continued)

better low-frequency magnetic sensor. The present disclosure further provides an electromagnetic prospecting equipment.

10 Claims, 10 Drawing Sheets

(51) Int. Cl.
*H01F 27/28* (2006.01)
*H03F 3/45* (2006.01)

(52) U.S. Cl.
CPC ... *H03F 3/45475* (2013.01); *H03F 2200/261* (2013.01); *H03F 2200/294* (2013.01)

(58) Field of Classification Search
CPC ......... H03F 2200/261; H03F 2200/294; H03F 1/26; H03F 3/45968; H03F 2200/168; H03F 2203/45138; H03F 2203/45526; H03F 2203/45534; H03F 2203/45621; G01R 33/06
See application file for complete search history.

(56) References Cited

U.S. PATENT DOCUMENTS

2016/0187519 A1* 6/2016 Widmer .................. B60L 53/68
324/222
2016/0352265 A1* 12/2016 Guo .......................... H02P 6/16

FOREIGN PATENT DOCUMENTS

| | | |
|---|---|---|
| CN | 106443508 A | 2/2017 |
| CN | 106483480 A | 3/2017 |
| CN | 108802832 A | 11/2018 |
| JP | 0943328 A | 2/1997 |

OTHER PUBLICATIONS

Written Opinion of the International Searching Authority for No. PCT/CN2018/119362.

* cited by examiner

INDUCTIVE MAGNETIC SENSOR AND ELECTROMAGNETIC PROSPECTING EQUIPMENT

CROSS REFERENCE

The present application is a continuation-application of International (PCT) Patent Application No. PCT/CN2018/119362, filed on Dec. 5, 2018, the entire contents of which are hereby incorporated by reference in its entirety.

TECHNICAL FIELD

The present disclosure relates to the geophysical prospecting field, and in particular to an inductive magnetic sensor and an electromagnetic prospecting equipment.

BACKGROUND

An inductive magnetic sensor (hereinafter referred to as a magnetic sensor) is a device based on the Faraday's law of electromagnetic induction, which uses a direct-proportion relationship between an output voltage of a coil and a change amount of magnetic flux passing through the coil, to indirectly measure the magnetic field by directly measuring the output voltage of the coil. MT magnetic sensor is characteristic by obtaining a magnetic-field signal in the low frequency or the ultra-low frequency, winding a coil of tens of thousands of turns on a high-permeability magnetic core, and using a low-noise amplifier circuit and a magnetic-flux negative-feedback structure, to convert a magnetic field into a measurement voltage.

As shown in FIG. 1, an equivalent circuit diagram of an inductive magnetic sensor is shown, in which, B is a measured external magnetic field;
$C_p$ is a parasitic capacitance of a measurement coil;
$L_p$ is a self-inductance of the measurement coil;
$R_p$ is a resistance of the measurement coil;
$L_s$ is a self-inductance of a feedback coil;
$R_s$ is a resistance of the feedback coil;
$R_{fd}$ is a feedback resistance;
M is a mutual inductance between the feedback coil and the measurement coil;
$N_p$ and Ns are turns of the measurement coil and the feedback coil respectively;
A is a magnification of an amplifier circuit;
$V_i$ is an input of the amplifier circuit;
$V_{out}$ is an output of the amplifier circuit;
e is an induced electromotive force of the measurement coil.

According to the model of the circuit as shown in FIG. 1, a transfer function of the magnetic sensor may be obtained as:

$$\frac{V_{out}}{B} = \frac{-j\omega\mu_a N_p SA}{1 + j\omega CR_p - \omega^2 L_p C + \frac{j\omega MA}{R_{fb}}} \quad (1)$$

wherein, $\mu_a$ is an effective permeability, and S is an effective cross-sectional area of the magnetic circuit.

Due to the wide range of the applications of the magnetic sensor, there are many people working on the inductive magnetic sensor at home and abroad. In the electromagnetic prospecting field, typical products of the MT magnetic sensor include the MFS-06e of the Metronix corporation in Germany, and the MTC-80 of the Phoenix corporation in Canada, etc. In China, main institutions researching the MT magnetic sensor include the Central South University, the Jilin University, the Institute of Electronics of the Chinese Academy of Sciences, and they all have achieved excellent applications.

Although there are many institutions to research the MT magnetic sensor, the methods used by these institutions or organizations, usually improve an effective permeability of a magnetic core to improve a sensitivity of a magnetic sensor after determining the number of turns of a coil within a range permitted by a volume and a weight, and use a chopper-stabilized amplifying circuit to suppress the low-frequency 1/f noise effect. According to an initial permeability parameter of a magnetic core material and the demagnetization factor formula, the magnetic core should have a length larger than 1.0 m, to make a length-to-diameter ratio larger than 40:1, for achieving a sufficient effective permeability, thus it is inconvenient in field working. In recent years, some institutions or organizations have adopted a Flux Concentrator technology, to make a short magnetic core have an effective permeability comparable to that of a conventional elongated magnetic core, thereby miniaturizing the magnetic sensor.

In fact, by increasing the length-to-diameter ratio of the magnetic core or adding the flux concentrator, the effective permeability may be effectively improved; however, they cannot expand the low-frequency bandwidth, thus the optimization of the magnetic sensor is limited.

In order to stabilize the system, a resonant frequency of the coil must be higher than a measured passband frequency, and magnetic flux feedback is introduced to suppress the quality factor of the magnetic sensor at the resonant frequency point. There is no problem with this thought itself, since it must ensure the system has sufficient stability, which is the premise of the design of the system. However, it cannot normally obtain a signal when the measured signal is in the ultra-low frequency since the sensitivity of the ultra-low frequency signal is extremely low; on the other hand, noise in the high frequency is very large, thus it causes an embarrassment of an extremely-low signal-to-noise ratio in the low-frequency measurement.

SUMMARY OF THE DISCLOSURE

In view of this, embodiments of the present disclosure provide an inductive magnetic sensor and an electromagnetic prospecting equipment, for further extending the low-frequency characteristics of the magnetic sensor, to obtain a more excellent low-frequency magnetic sensor.

In a first aspect, the present disclosure provides an inductive magnetic sensor, comprising a signal pre-amplifying measurement circuit, a feedback loop, a magnetic core and coil group, a low-noise autozero processing circuit and an output protection module. The magnetic core and coil group is electrically connected between the signal pre-amplifying measurement circuit and the feedback loop, the signal pre-amplifying measurement circuit comprises the low-noise autozero processing circuit, and the feedback loop and the low-noise autozero processing circuit are electrically connected to the output protection module respectively.

In an optional solution, the signal pre-amplifying circuit further comprises at least one pre-amplifying unit and at least one resonant notch filter, when a measurement magnetic-field signal is lower than 100 Hz, at least one capacitor is in parallel with input terminals of the at least one pre-amplifying unit, and the at least one resonant notch filter is electrically connected to the low-noise autozero processing circuit.

In an optional solution, when a measurement magnetic-field signal is higher than 100 Hz, the signal pre-amplifying measurement circuit comprises at least one pre-amplifying unit.

In an optional solution, the magnetic core and coil group comprises a feedback coil and a measurement coil, the feedback coil and the measurement coil are coupled together, the measurement coil is in parallel with the capacitor, and the feedback coil is electrically connected to the feedback loop.

In an optional solution, the signal pre-amplifying measurement circuit comprises two groups of pre-amplifying units and resonant notch filters, which are a first pre-amplifying unit, a second pre-amplifying unit, a first resonant notch filter and a second resonant notch filter, the first resonant notch filter and the second resonant notch filter are connected together via first resistors to output as an output terminal, and the output terminal is connected in parallel with a grounding capacitor to a reference ground.

In an optional solution, the low-noise autozero processing circuit is a switching autozero circuit.

In a second aspect, the present disclosure provides an electromagnetic prospecting equipment, comprises the inductive magnetic sensor as described in the above.

From the above technical solutions, it can be seen that, the embodiments of the present disclosure have the following advantages:

The present disclosure provides the inductive magnetic sensor and the electromagnetic prospecting equipment, which comprises the signal pre-amplifying measurement circuit, the feedback loop, the magnetic core and the coil, the low-noise autozero processing circuit and the output protection module. Input terminals of the coil are electrically connected to the signal pre-amplifying measurement circuit, the signal pre-amplifying measurement circuit and the low-noise autozero processing circuit, the output terminal of the coil is electrically connected to the feedback loop, and the feedback loop and the low-noise autozero processing circuit are electrically connected to the output protection module respectively. By introducing the resonant notch filter, it may extend the passband thereof to the low frequency, and extend the low-frequency characteristic of the magnetic sensor, to obtain an excellent low-frequency magnetic sensor.

DETAILED DESCRIPTION

In order to enable those skills in the art to better understand the solutions of the present disclosure, the technical solutions in the embodiments of the present invention will be described clearly and comprehensively in the following with reference to the accompanying drawings in the embodiments of the present disclosure. Obviously, the described embodiments are only some of the present disclosure, but not all. Based on the embodiments of the present disclosure, all other embodiments obtained by those of ordinary skills in the art without creative efforts shall fall within the scope of the present disclosure.

Figure 2:
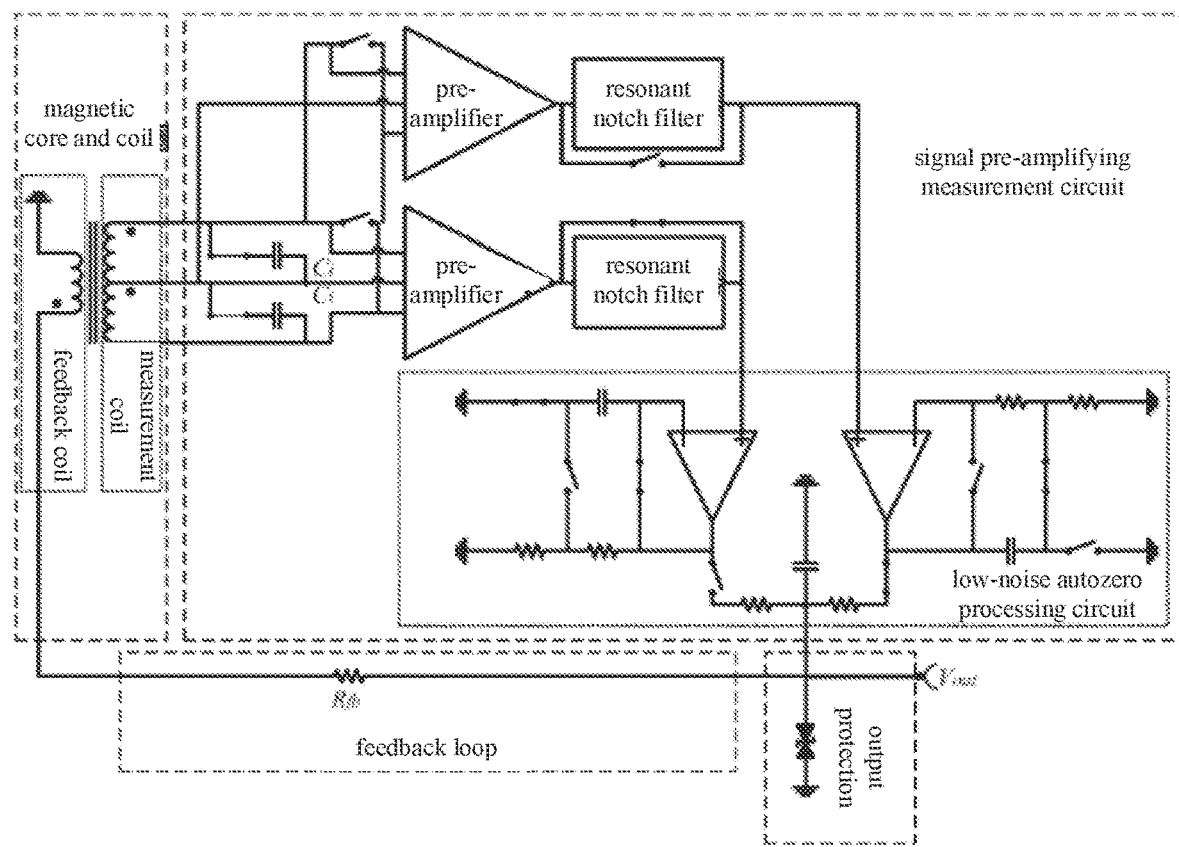
FIG. 2 is a circuit block view of an inductive magnetic sensor according to an embodiment of the present disclosure.

With reference to FIG. 2, an inductive magnetic sensor in accordance with an embodiment of the present disclosure, includes a signal pre-amplifying measurement circuit, a feedback loop, a magnetic core coil group, a low-noise autozero processing circuit, and an output protection module. the magnetic core and coil group is electrically connected between the signal pre-amplifying measurement circuit and the feedback loop, the signal pre-amplifying measurement circuit comprises the low-noise autozero processing circuit, and the feedback loop and the low-noise autozero processing circuit are electrically connected to the output protection module respectively, resonant notch filters are added to further extend the bandwidth to the low frequency, thus the low-frequency characteristics of the magnetic sensor may be expanded, and a more excellent low-frequency magnetic sensor may be obtained.

The signal pre-amplifying measurement circuit includes pre-amplifying units and resonant notch filters. The resonant notch filters are used to perform a notching operation at a resonant frequency point of a measurement coil. When the frequency of the measured magnetic field is lower than 100 Hz, capacitors are arranged in parallel with input terminals of the pre-amplifying units, and the resonant notch filters are electrically connected to the low-noise autozero processing circuit. When the frequency of the measured magnetic field is higher than 100 Hz, the signal pre-amplifying measurement circuit includes the pre-amplifying units.

The magnetic core and coil group includes a feedback coil and a measurement coil, and the feedback coil and the measurement coil are coupled together. The measurement coil is parallel with the capacitors, and the feedback coil is electrically connected to the feedback loop.

The signal pre-amplifying measurement circuit includes two groups of the pre-amplifying units and the resonant notch filters, which are a first pre-amplifying unit, a second pre-amplifying unit, a first resonant notch filter and a second resonant notch filter. The first resonant notch filter and the second resonant notch filter are connected via a first resistor to output, which is as an output terminal; and the output terminal is connected in parallel with a grounding capacitor to a reference ground.

In this embodiment, the low-noise autozero processing circuit uses a switch autozero circuit or a chopper-stabilized operation amplifying circuit, which may be flexibly selected in the art and is not limited herein.

The magnetic sensor of the present disclosure, incorporates the capacitor at the input terminals when measuring the ultra-low frequency under the premise of optimizing the magnetic core. Since the negative feedback of the magnetic flux is difficult to affect the magnetic-field conversion ability of the magnetic sensor, the capacitor is incorporated and a closed loop is opened at the same time, thus it does not have the instability problem of the self-oscillation. With the introduction of the notch filters, it may further extend the bandwidth to the low frequency. For avoiding the pseudo-morphism problem of the traditional chopper-stabilized amplifying circuit, the novel autozero magnetic-sensor processing circuit is applied, to further extend the low-frequency characteristics of the magnetic sensor and obtain a more excellent low-frequency magnetic sensor.

The inductive magnetic sensor of the present disclosure, provides a solution for measuring magnetic field signals below 100 Hz. When measuring magnetic field signals above 100 Hz, it is necessary to remove the input capacitor and the resonant notch filters, and close the feedback loop, simultaneously.

As shown in FIG. 2, the magnetic sensor of the present disclosure may include the high-permeability magnetic core, the coils, the low-noise amplifier circuit and the feedback loop. The difference is that, the present disclosure adds the two capacitors at the measurement coil when measuring low-frequency signals, and the low-noise amplifier circuit is not the commonly-used chopper amplifier, but the low-noise autozero processing circuit specially designed for extending the low-frequency characteristics of the magnetic sensor.

The pre-amplifier cooperates with the capacitor, to move the resonant frequency of the magnetic sensor into the low frequency. After moving the resonant frequency, the negative feedback of the magnetic flux will not work, thus the magnetic sensor only needs to perform the open loop measurement, and it will not generate the stability problem of self-oscillation. Simultaneously, the capacitor can suppress the high-frequency noise, and further increase the gain of the amplifier without saturation, such that the frequency characteristic (the pass band) of the magnetic sensor moves to the direction of the low frequency, thereby achieving the purpose of spreading spectrum.

Different from the design of the chopping amplification, the low-noise stabilization technology of the present disclosure adopts three processing stages, such as the pre-amplifying operation, the filtering operation and the autozero operation. Thus, the circuit has the excellent autozero characteristics, especially has the great performance for suppressing the 1/f noise, the offset voltage, the temperature drift of the offset voltage, the offset current, and the temperature drift of the offset current.

When the measured magnetic field frequency is lower than 100 Hz, it needs to insert the capacitor in parallel with the connection between the coil and the input terminals of the pre-amplifier, and cooperate with the latter resonant notch filter, to ensure the pass band of the system further moves to the low frequency and the effect of the feedback loop may be ignored simultaneously. When the measured magnetic field frequency is higher than 100 Hz, it needs to remove the shunt capacitor at the input terminal, and ensure the resonant notch filter not to work simultaneously by shorting the resonant notch filter, for avoiding destroying the normal measurement. For ensuring the gain of the system larger than 1 and stable, it needs to use the negative loop of the magnetic flux. In addition, when the measured frequency is larger than 100 Hz, the resonant notch filter may be replaced by the low-pass filter, and it must ensure the measured frequency being in the passband range, thereby reducing the influence of the high-frequency noise.

Figure 3:
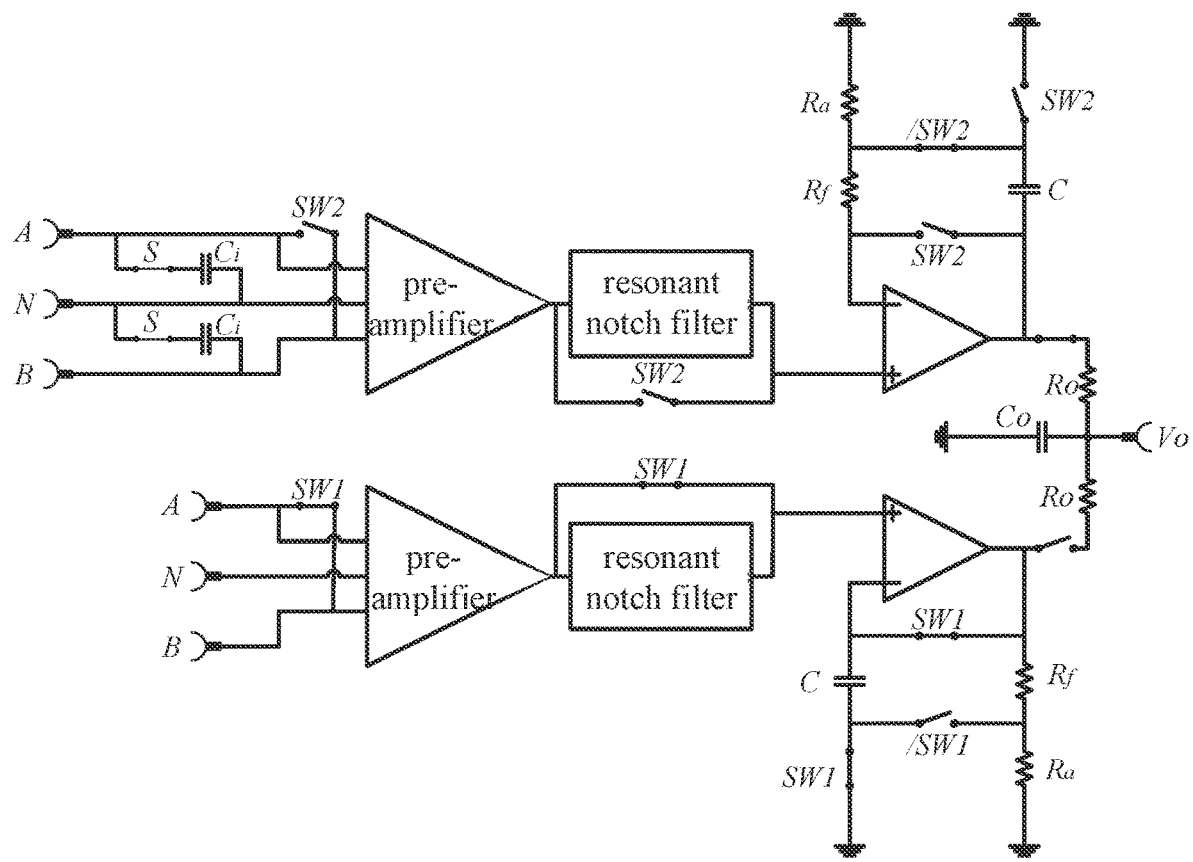
FIG. 3 is a structural block view of a signal pre-amplifying measurement circuit of the inductive magnetic sensor according to an embodiment of the present disclosure.

The signal pre-amplification measurement circuit is as shown in FIG. 3. The signal pre-amplification measurement circuit includes two completely same circuits, the two circuits are connected together via $R_o$ finally to output, and an output terminal thereof is in parallel with a capacitor to the reference ground. Taking one of the processing circuits as an example, starting from the left, N is a mid-point tap of the measurement coil, A and B are a top-point tap and a bottom-point tap of the measurement coil respectively, which are loaded to a pre-amplifier with dual inputs and single output, and then connected to a resonant notch filter. The resonant notch filter is mainly configured for further extending the passband to move to the low frequency, to enhance the low-frequency components. The resonant notch filter is sent to a de-noising core circuit, which works in two modes via a switching control circuit. Up and low circuits of FIG. 3 shows states of the two modes respectively: one is tracking noise and storing the noise signal in the capacitor C, as shown in an lower half of FIG. 3; another is subtracting the circuit noise signal stored in the capacitor C from the input signal, as shown in the lower half of FIG. 3.

The upper and lower circuits of FIG. 3 work complementarily with each other. When one of the circuits works in the noise tracking state, another thereof works in the measurement state and output the measurement signal, which is filtered by Ro and the capacitor Co to be as the output signal. Ro and Co is selected to ensure the cutoff frequency higher than the upper-limit frequency of the measurement passband.

The present disclosure may implement the goal of the common use of one magnetic sensor in the frequency-domain electromagnetic prospecting method, which can greatly reduce the volume and the weight of the magnetic sensor, and is greatly convenient in the field work.

An embodiment of the present disclosure provides an applicant scenario of the inductive magnetic sensor for illustration.

A magnetic sensor with a resonant frequency of 20 kHz is in a laboratory, which is applied in the Controlled Source Audio Magnetotelluric (CSAMT) detection. The self-inductance of the measurement coil is 0.3459H, the parasitic capacitance is 170 pF, the resistance of the measurement coil is 1934Ω, the equivalent area of the coil is S=112.903 mm$^2$, the number of turns of the measurement coil is 10000, the feedback resistance $R_f$=1 kΩ, the number of turns of the feedback coil is 35, the effective permeability is 705, and the magnification is 1. Thus, the conversion relationship of the magnetic flux of the magnetic sensor with or without the feedback, is as shown in FIG. 4.

Figure 4:
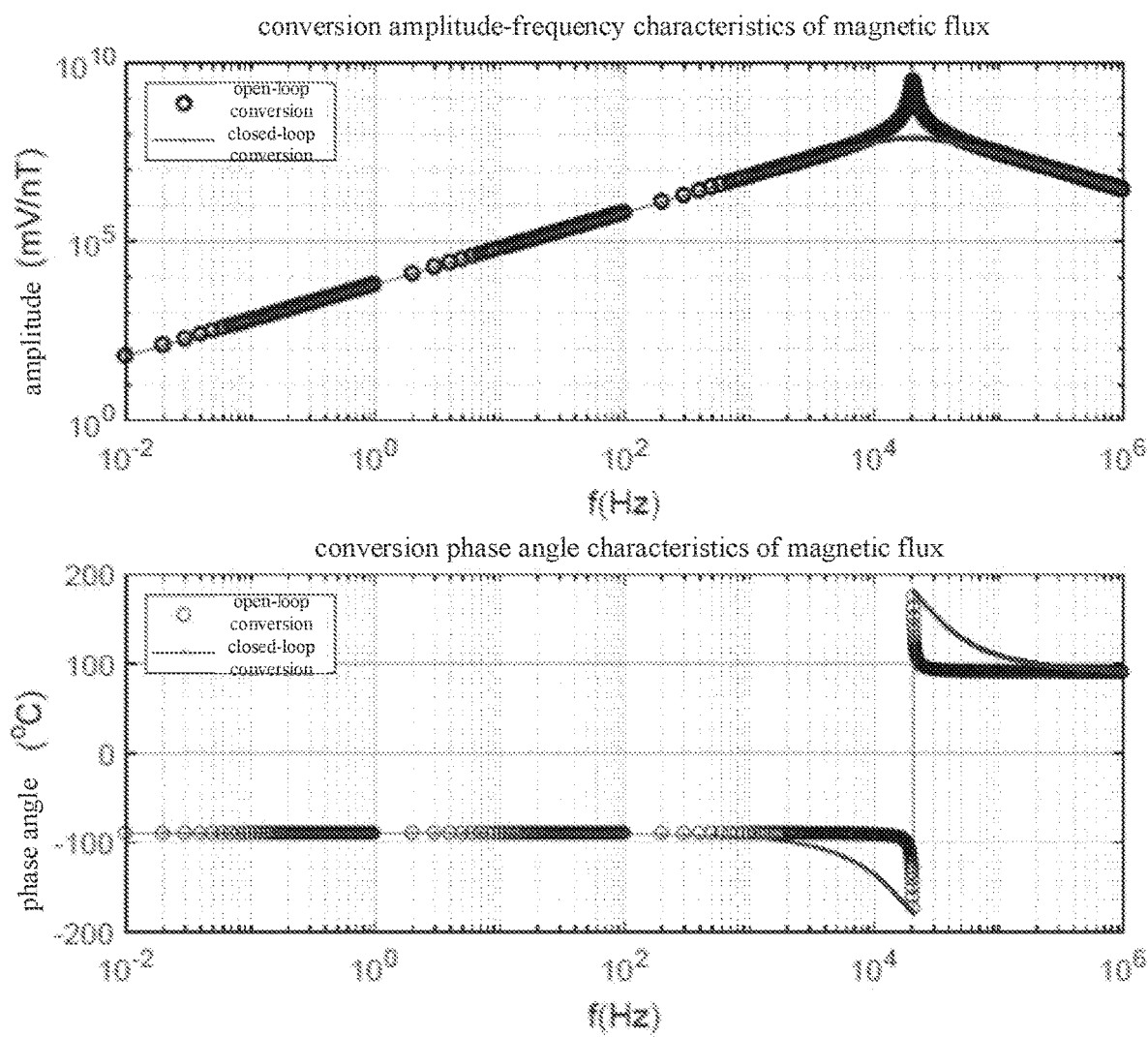
FIG. 4 is a schematic view of conversion characteristics of the inductive magnetic sensor according to an embodiment of the present disclosure.

FIG. 4 shows the conversion characteristics of the magnetic sensor. It can be seen that, the resonant frequency of the magnetic sensor is 20 kHz, and the quality factor at the resonance point is greatly reduced after adding the closed-loop negative feedback of the magnetic flux, thus the system may be work stably. When the measured frequency is a low frequency of less than 100 Hz, obviously, the resonant frequency is such high and is not conducive to perform the measurement. After incorporating the capacitor of 2 uF at the input terminals of the pre-amplifier, the resonance point of the magnetic sensor moves to a low frequency of 170 Hz. In order to further extend the passband of the system to the low frequency and increase the gain of the system, the notch filter is added at the new resonance point. After incorporating the capacitor, the conversion characteristics of the magnetic filed under different conditions are as shown in FIG. 5.

Figure 5:
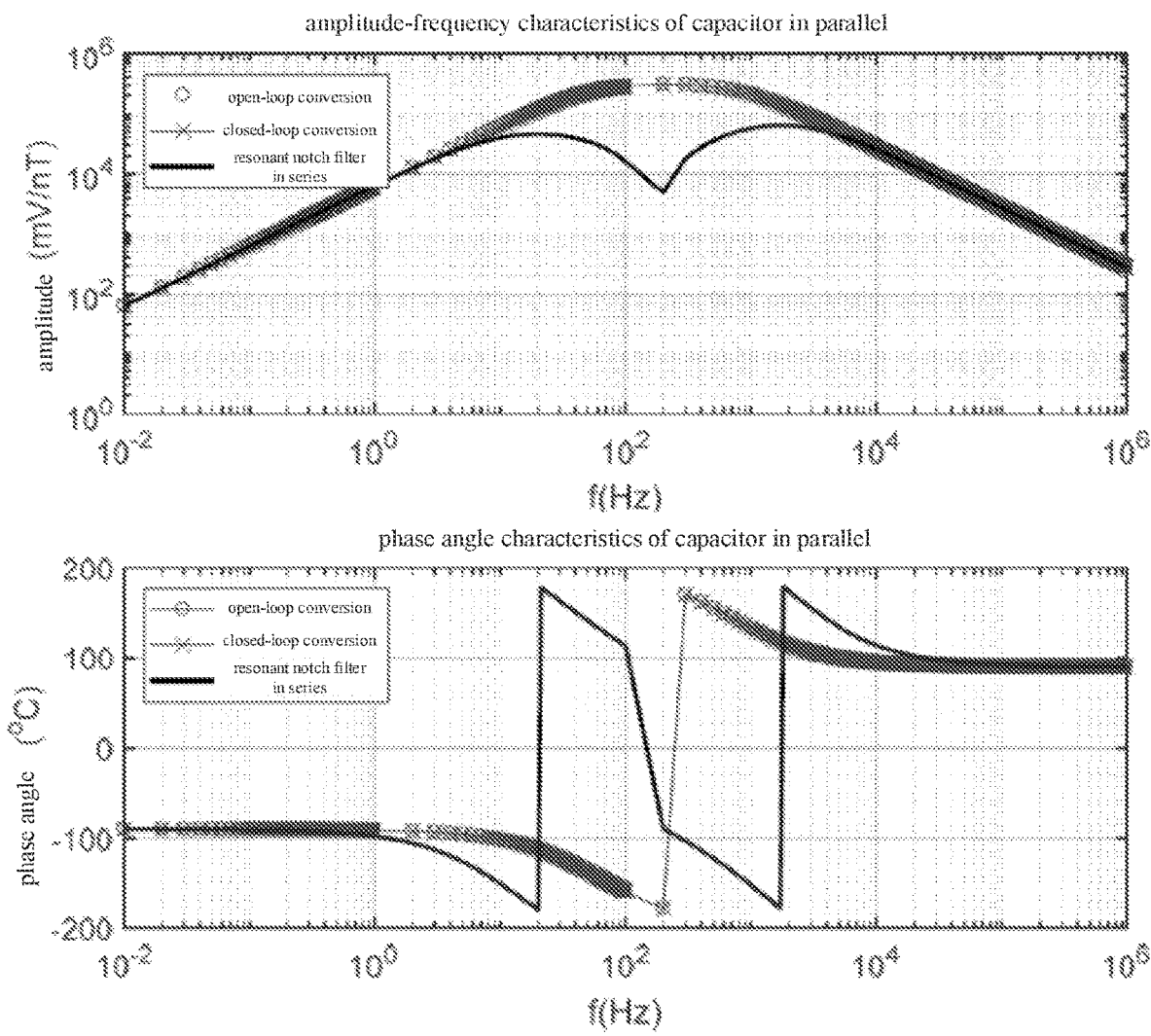
FIG. 5 is a schematic view of conversion characteristics of the inductive magnetic sensor having capacitor in parallel according to an embodiment of the present disclosure.
Figure 6:
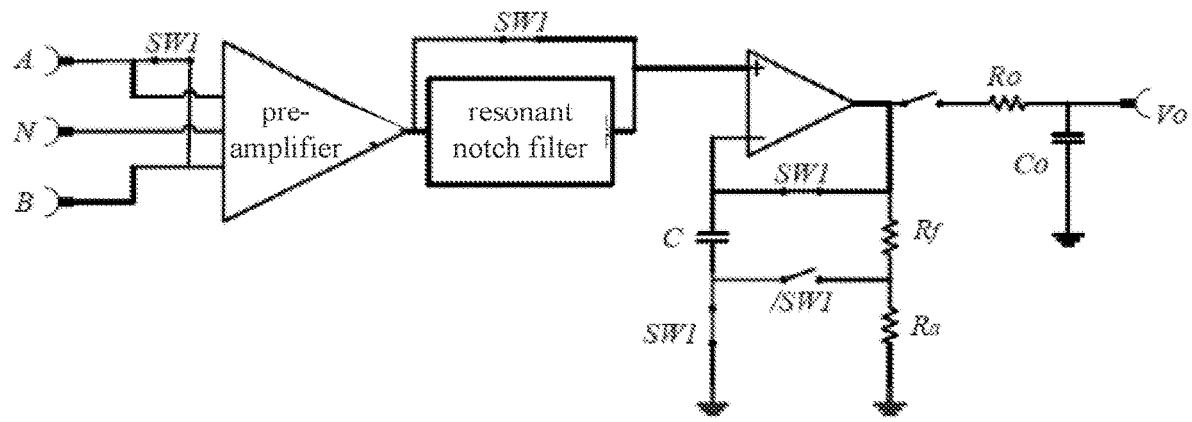
FIG. 6 is a circuit view of a de-noising circuit of the inductive magnetic sensor according to an embodiment of the present disclosure.

From FIG. 5, it can be seen that, after incorporating the capacitor, the conversion characteristics of the magnetic sensor is shown that: when the resonance is transferred to the low frequency, the closed loop basically does not work, and the presence or absence of the negative feedback of the magnetic flux has no effect on the magnetic sensor, such that the influence of the negative feedback of the magnetic flux may be ignored after incorporating the capacitor. If not introducing the notch filter, the system will have a high conversion performance at 170 Hz, which influence the low-frequency measurement. After introducing the notch filter, the magnetic sensor is forced to lower the conversion performance at 170 Hz, such that the frequency band of the magnetic sensor further extends to the low frequency, and the magnetic sensor may further improve the gain of the system to obtain the low-frequency signal without saturation.

Figure 1:
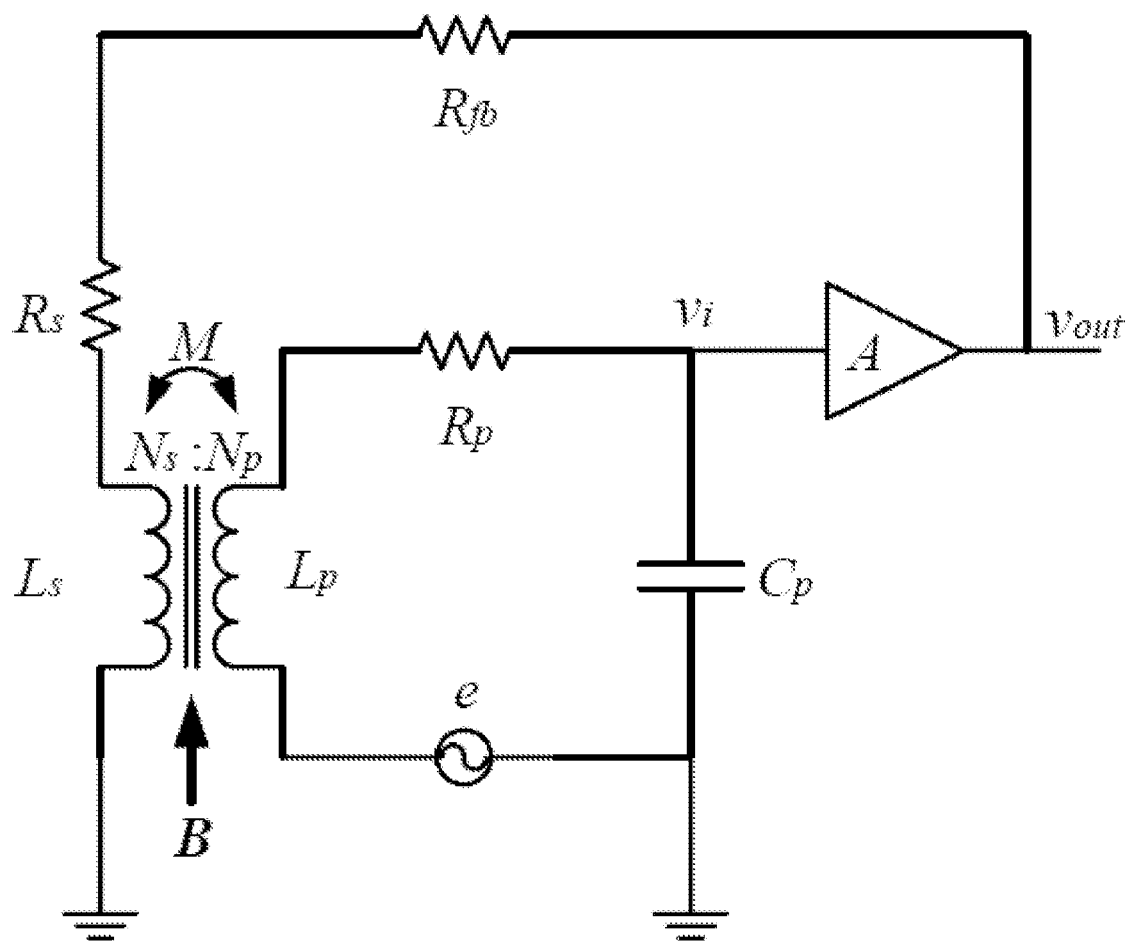
FIG. 1 is an equivalent circuit view of a conventional inductive magnetic sensor.

Regarding the problem of de-noising, it selects a half of the circuit for illustration. As shown in FIG. 1, the denosising circuit is that: when SW1 is closed, the input of the pre-amplifier is 0, the pre-amplifier outputs the noise voltage $v_{noise1}$, then the noise voltage of the pre-amplifier is sent to a non-inverting input terminal of a next-stage voltage follower, thus the total noise of the pre-amplifier and the post-stage operational amplifier is obtained on the sampling capacitor C. If assuming the noise voltage of the post-stage operational amplifier is $v_{noise2}$, the voltage of the capacitor is:

$$v_c = v_{noise1} + v_{noise2} \quad (2)$$

When SW1 is open, since the capacitor C has saved the total noise of the pre-amplifier and the present-stage operational amplifier, after inputting the measurement signal $v_i$, the output voltage sent to the post stage is:

$$v_o = \frac{R_f}{R_a}(v_i + v_{noise1} + v_{noise2} - v_c) \quad (3)$$

Since the circuit is mainly the 1/f noise, the offset voltage, the temperature drift of the offset voltage, the offset current, and the temperature drift of the offset current, the frequencies of these noises are all low, thus the noises may be considered unchanged before and after switching under the sufficiently-high switching frequency condition. Therefore, the formula (2) may be brought into the formula (3), to obtain the output voltage of the post-stage operational amplifier as:

$$v_o = \frac{R_f}{R_a} \cdot v_a \quad (4)$$

It can be seen that, the output has eliminated the noises and retained the measurement signal.

Figure 7:
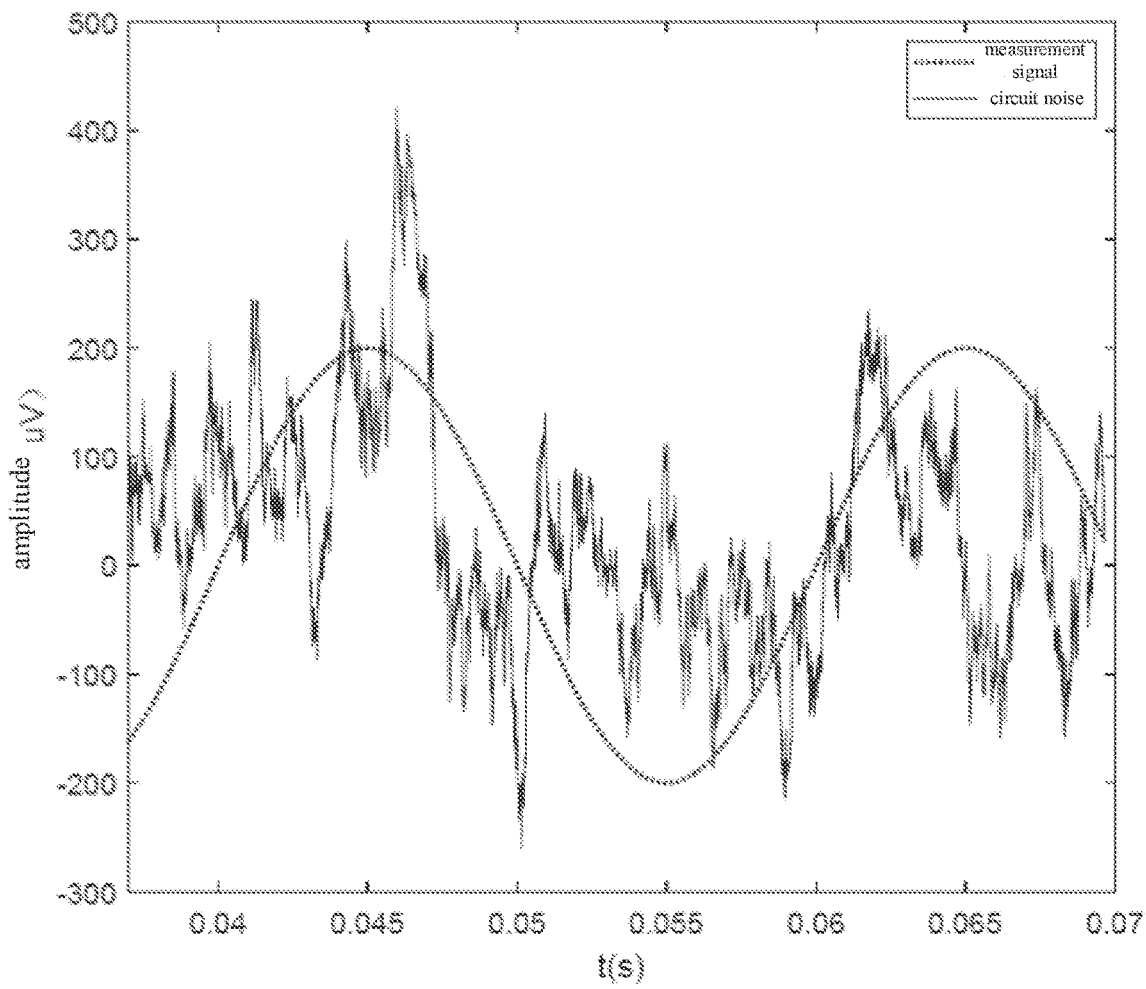
FIG. 7 is a schematic view of measurement signal and circuit noise of the inductive magnetic sensor according to an embodiment of the present disclosure.

For a sinusoidal signal of 200 uV and 50 Hz, a 1/f noise with a peak-to-peak value of 400 uV is in the circuit, as shown in FIG. 7, which are the measurement signal and the circuit noise.

By using the circuit as shown in FIG. 3 to process, the input signal is a combination of the measurement signal plus the circuit noise, the output signal is an output processed by FIG. 3. The waves of the input and the output of the circuit are as shown in FIG. 8, which are the input and output signals of the de-noising circuit.

Figure 8:
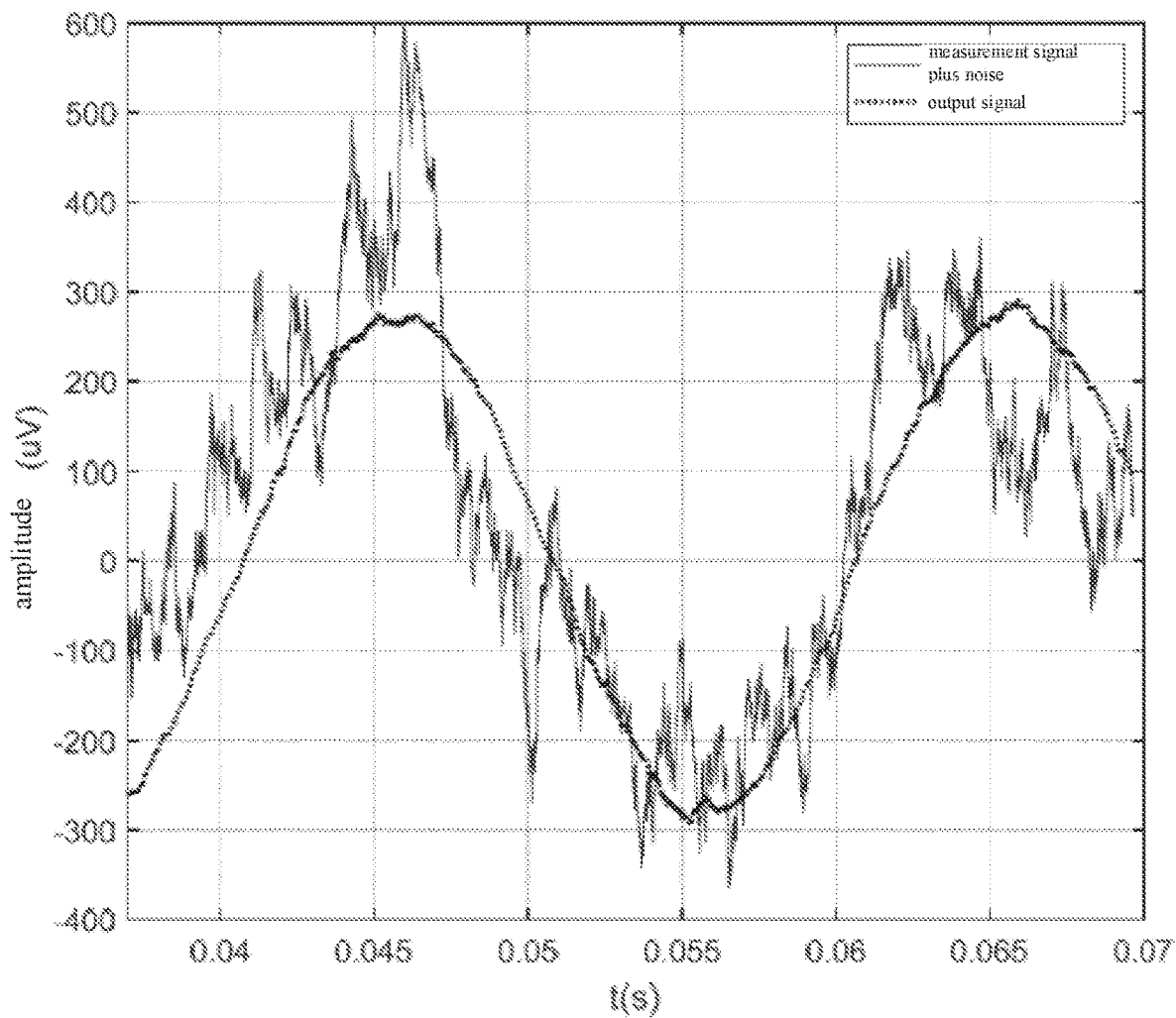
FIG. 8 is a schematic view of input signal and output signal of the de-noising circuit of the inductive magnetic sensor according to an embodiment of the present disclosure.

From FIG. 8, it can be seen that, the de-noising circuit may well eliminate the circuit noise, and effectively suppress the low-frequency noise brought by the circuit itself, thus it may provide a favorable guarantee for extending the detection capability of the low-frequency magnetic sensor.

Of course, the premise of this circuit is that: the noise is basically unchanged relative to the measurement signal before and after switching. When the measurement signal is very low, the change of the noise before and after switching cannot be ignored relative to the measurement signal, thus the effect of the processing circuit will be worse, and it may further improve the switching frequency. The changing amplitude of the noise is smaller in a smaller time, the effect of the circuit is better, thus the high-frequency noise may be firstly filtered under the condition of the frequency of the measurement signal being not high, to obtain a better effect.

Figure 9:
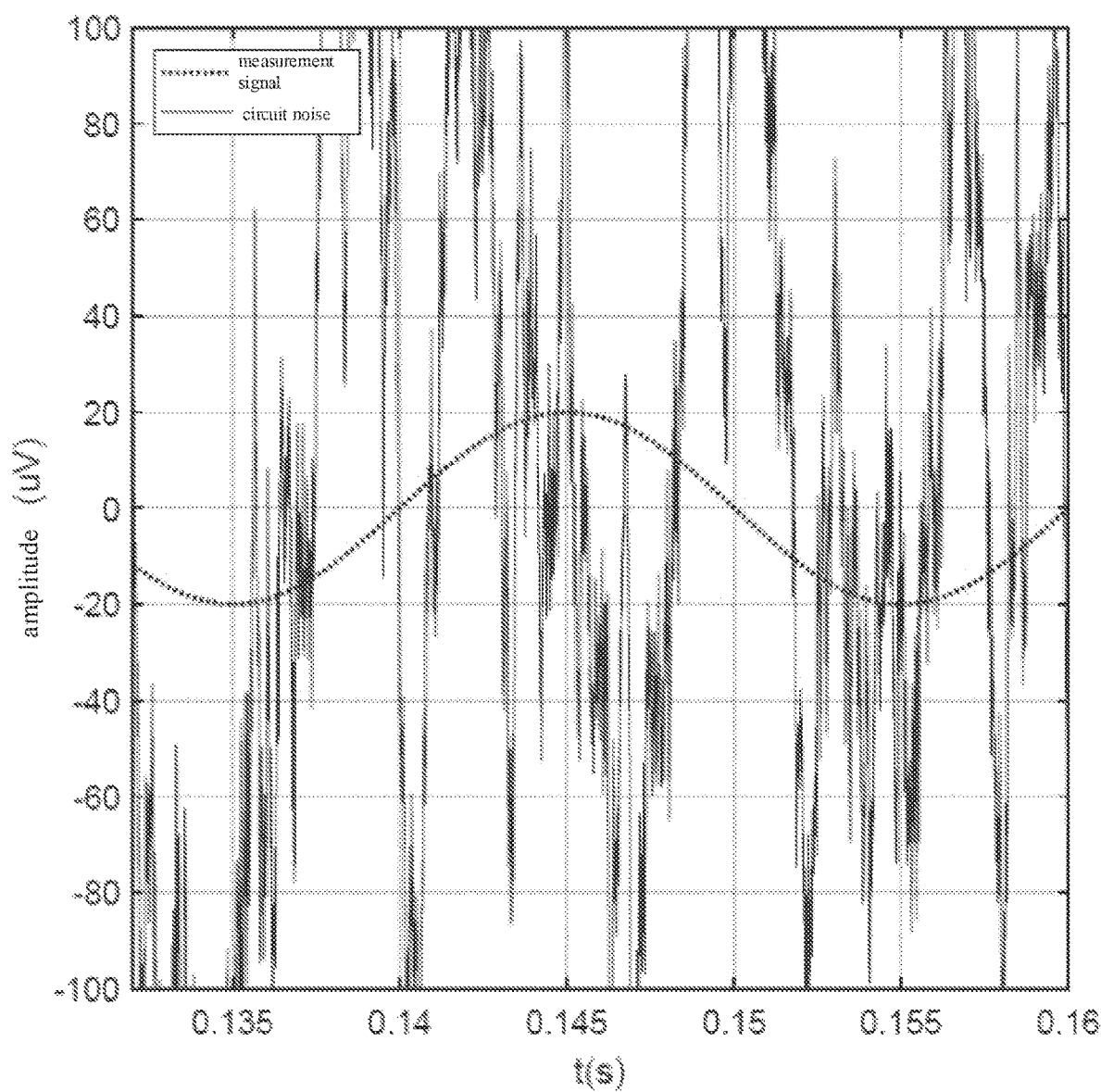
FIG. 9 is a schematic view of low signal-noise-ratio input of the inductive magnetic sensor according to an embodiment of the present disclosure.

If the measurement signal is still 50 Hz, the input signal-to-noise ratio is lower, the input noise remains unchanged and the measurement signal is reduced by 10 times to 20 uV, as shown in the low signal-to-noise ratio of FIG. 9.

Figure 10:
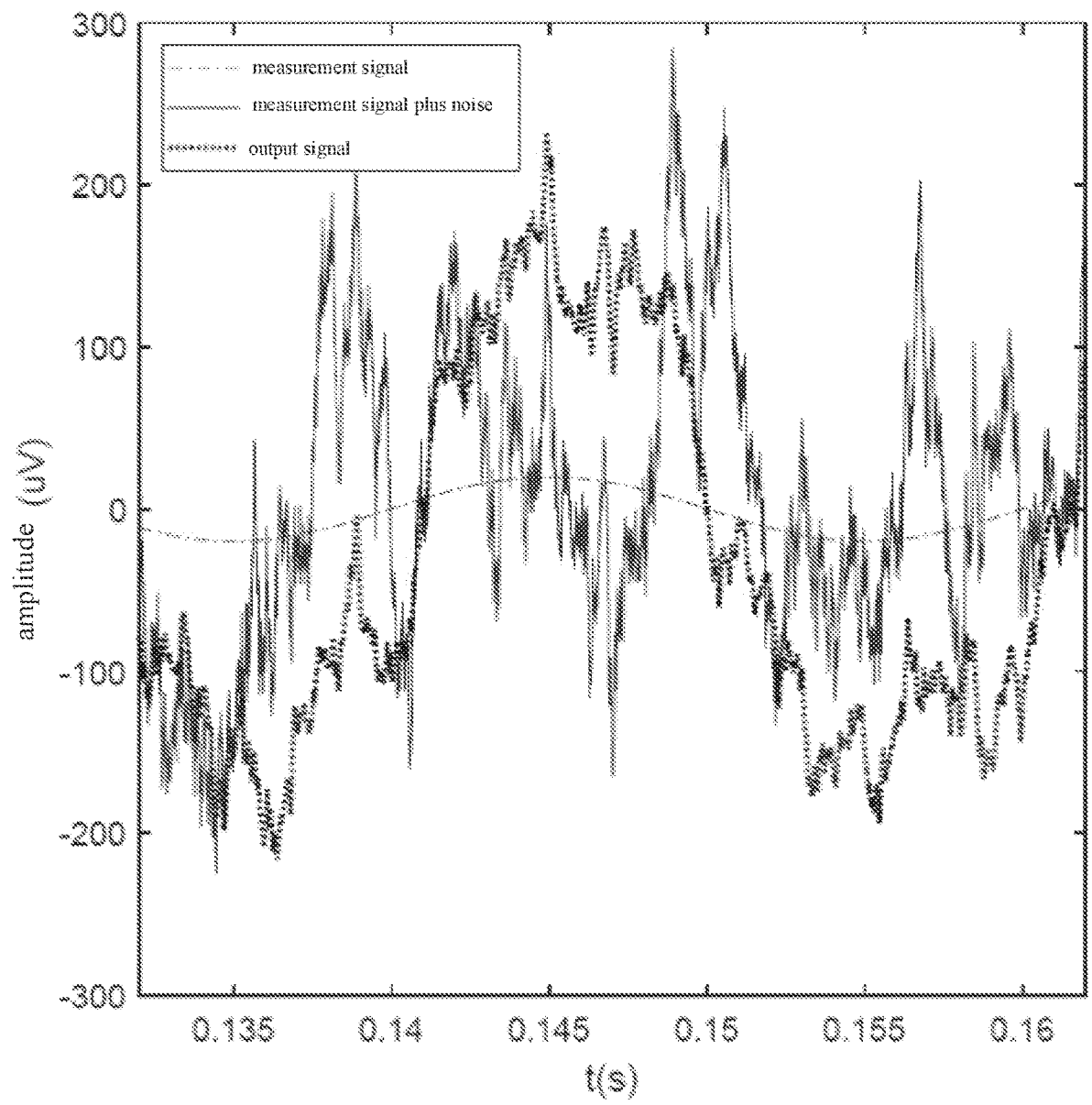
FIG. 10 is a schematic view of a result processed by low signal-noise-ratio circuit of the inductive magnetic sensor according to an embodiment of the present disclosure.

The magnification of the system is adjusted to 10 times, and the obtained input and output waves are compared as shown in FIG. 10, which are a result processed by the low signal-to-noise circuit.

Figure 11:
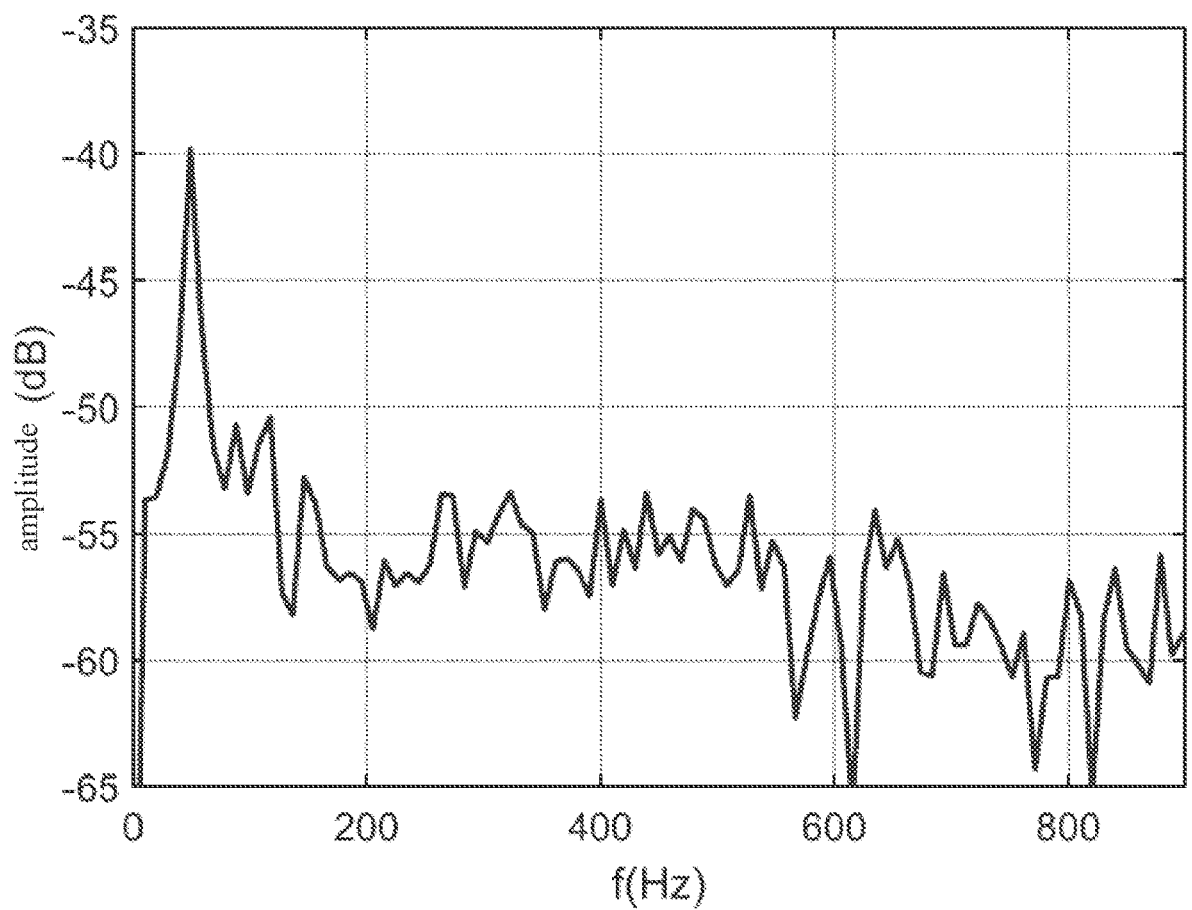
FIG. 11 is a schematic view of output power spectrum of the de-noising circuit of the inductive magnetic sensor according to an embodiment of the present disclosure.

The power spectrum of the output signal with the measurement time of 0.16 s (about 8 measurement-signal cycles) is as shown in FIG. 11.

FIG. 11 shows the output power spectrum of the de-noising circuit. From FIG. 11, it can be seen that, when the peak-to-peak value of the signal is 40 uV and the peak-to-peak value of the noise reaches 400 uV, the magnification of the system reaches 10 times, and the output signal of the de-noising circuit still can achieve a desired noise-processing effect. Furthermore, the circuit may well eliminate the 1/f noise.

Correspondingly, the present disclosure provides an electromagnetic prospecting equipment, which has the inductive magnetic sensor as described in the above.

The present disclosure provides an electromagnetic prospecting equipment, to implement the goal of the common use of one magnetic sensor in the frequency-domain electromagnetic prospecting method, therefore it may greatly reduce the volume and the weight of the magnetic sensor, and be greatly convenient in the field work.

Those skilled in the art may clearly understand that, for being convenient and concise in the description, the detailed working process of the system, device and unit described in the above, can refer to the corresponding process in the foregoing embodiments of the method, which will not be repeated herein.

In the several embodiments provided in the present disclosure, it should be understood that, the disclosed system, device, and method may be implemented in other ways. For example, the embodiments for describing the device in the above are only schematic. For example, the division of the units is only a division in logical functions. In actual implementation, there may be other divisions, for example, multiple units or components may be combined or be integrated into another system, or some features may be ignored or not implemented. In addition, the displayed or discussed mutual coupling or direct coupling or communication connection may be indirect coupling or communication connection between devices or units via some interfaces, and may be in electrical, mechanical or other forms.

The units described as separate components may or may not be physically separated, and the components displayed as units may or may not be physical units, that is, they may be located in one place, or may be distributed on multiple network units. Some or all of the units may be selected according to actual needs to achieve the purpose of the present embodiments.

In addition, each functional unit in each of the embodiments of the present disclosure may be integrated into one processing unit, or each unit may exist alone physically, or two or more units may be integrated into one unit. The above integrated unit can be implemented in the form of hardware or software function unit.

Those ordinarily skilled in the art may understand that, all or part of the steps in the various methods of the above embodiments may be implemented by instructing relevant hardware through a program. The program may be stored in a computer-readable storage medium, and the storage medium may include: the Read only memory (ROM, Read Only Memory), the random access memory (RAM, Random Access Memory), the magnetic disk or the optical disk, etc.

The inductive magnetic sensor and the electromagnetic prospecting equipment provided in the present described have been described detailedly in the above. For those ordinarily skilled in the art, based on the ideas of the embodiments of the present disclosure, there will be changes in the detailed implementation manner and the application range. In summary, the content of the present specification should not be interpreted as limiting the present disclosure.

What is claimed is:

1. An inductive magnetic sensor, comprising: a signal pre-amplifying measurement circuit, a feedback loop, a magnetic core and coil group, and an output protection module, wherein the magnetic core and coil group is electrically connected between the signal pre-amplifying measurement circuit and the feedback loop, the signal pre-amplifying measurement circuit comprises a low-noise autozero processing circuit, and both the feedback loop and the low-noise autozero processing circuit are electrically connected to the output protection module; the signal pre-amplifying measurement circuit comprises two groups of pre-amplifying units and resonant notch filters, which are a first pre-amplifying unit, a second pre-amplifying unit, a first resonant notch filter and a second resonant notch filter, the first resonant notch filter and the second resonant notch filter are connected together via first resistors to output as an output terminal, and the output terminal is connected in parallel with a grounding capacitor to a reference ground.

2. The inductive magnetic sensor according to claim 1, wherein when a measurement magnetic-field signal is lower than 100 Hz, at least one capacitor is in parallel with input terminals of the first pre-amplifying unit and the second pre-amplifying unit, and the first resonant notch filter and the second resonant notch filter are electrically connected to the low-noise autozero processing circuit.

3. The inductive magnetic sensor according to claim 1, wherein when a measurement magnetic-field signal is higher than 100 Hz, the signal pre-amplifying measurement circuit comprises at least one pre-amplifying unit.

4. The inductive magnetic sensor according to claim 1, wherein the magnetic core and coil group comprises a feedback coil and a measurement coil, the feedback coil and the measurement coil are coupled together, the measurement coil is in parallel with a capacitor, and the feedback coil is electrically connected to the feedback loop.

5. The inductive magnetic sensor according to claim 1, wherein the low-noise autozero processing circuit is a switching autozero circuit.

6. An electromagnetic prospecting equipment, comprising: an inductive magnetic sensor, comprising: a signal pre-amplifying measurement circuit, a feedback loop, a magnetic core and coil group, and an output protection module, wherein the magnetic core and coil group is electrically connected between the signal pre-amplifying measurement circuit and the feedback loop, the signal pre-amplifying measurement circuit comprises a low-noise autozero processing circuit, and both the feedback loop and the low-noise autozero processing circuit are electrically connected to the output protection module; the signal pre-amplifying measurement circuit comprises two groups of pre-amplifying units and resonant notch filters, which are a first pre-amplifying unit, a second pre-amplifying unit, a first resonant notch filter and a second resonant notch filter, the first resonant notch filter and the second resonant notch filter are connected together via first resistors to output as an output terminal, and the output terminal is connected in parallel with a grounding capacitor to a reference ground.

7. The electromagnetic prospecting equipment according to claim 6, wherein when a measurement magnetic-field signal is lower than 100 Hz, at least one capacitor is in parallel with input terminals of the first pre-amplifying unit and the second pre-amplifying unit, and the first resonant notch filter and the second resonant notch filter are electrically connected to the low-noise autozero processing circuit.

8. The electromagnetic prospecting equipment according to claim 6, wherein when a measurement magnetic-field signal is higher than 100 Hz, the signal pre-amplifying measurement circuit comprises at least one pre-amplifying unit.

9. The electromagnetic prospecting equipment according to claim 6, wherein the magnetic core and coil group comprises a feedback coil and a measurement coil, the feedback coil and the measurement coil are coupled together, the measurement coil is in parallel with a capacitor, and the feedback coil is electrically connected to the feedback loop.

10. The electromagnetic prospecting equipment according to claim 6, wherein the low-noise autozero processing circuit is a switching autozero circuit.

* * * * *